(12) United States Patent
Moens

(10) Patent No.: US 10,062,756 B2
(45) Date of Patent: Aug. 28, 2018

(54) SEMICONDUCTOR STRUCTURE INCLUDING A DOPED BUFFER LAYER AND A CHANNEL LAYER AND A PROCESS OF FORMING THE SAME

(71) Applicant: Semiconductor Components Industries, LLC, Phoenix, AZ (US)

(72) Inventor: Peter Moens, Zottegem (BE)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 14/867,131

(22) Filed: Sep. 28, 2015

(65) Prior Publication Data

US 2016/0126312 A1    May 5, 2016

Related U.S. Application Data

(60) Provisional application No. 62/072,607, filed on Oct. 30, 2014.

(51) Int. Cl.
*H01L 29/15* (2006.01)
*H01L 29/10* (2006.01)
(Continued)

(52) U.S. Cl.
CPC .... *H01L 29/1075* (2013.01); *H01L 29/66462* (2013.01); *H01L 29/7786* (2013.01);
(Continued)

(58) Field of Classification Search
CPC ............. H01L 29/1075; H01L 29/7789; H01L 29/66462; H01L 2924/13064
(Continued)

(56) References Cited

U.S. PATENT DOCUMENTS 7,456,442 B2    11/2008  Munns
7,586,156 B2    9/2009   Yedinak et al.
(Continued)

FOREIGN PATENT DOCUMENTS

EP          2538446 A2    12/2012
WO       2014130802 A1    8/2014

OTHER PUBLICATIONS

Maeda, Narihiko et al., "Enhanced Electron Mobility in AlGaN/InGaN/AlGaN Double-Heterostructures by Piezoelectric Effect," Japanese Journal of Applied Physics, vol. 38, Part 2, No. 7B, dated Jul. 15, 1999, pp. L799-L801.

(Continued)

*Primary Examiner* — Matthew Gordon
(74) *Attorney, Agent, or Firm* — Able Law Group, LLP

(57) ABSTRACT

A semiconductor structure can include a substrate, a high-voltage blocking layer overlying the substrate, a doped buffer layer overlying the high-voltage layer, and a channel layer overlying the doped buffer layer, wherein the doped buffer layer and the channel layer include a same compound semiconductor material, and the doped buffer layer has a carrier impurity type at a first carrier impurity concentration, the channel buffer layer has the carrier impurity type at a second carrier impurity concentration that is less than the first carrier impurity concentration. In an embodiment, the channel layer has a thickness of at least 650 nm. In another embodiment, the high-voltage blocking includes a proximal region that is 1000 nm thick and adjacent to the doped buffer layer, and each of the proximal region, the doped buffer layer, and the channel layer has an Fe impurity concentration less than $5 \times 10^{15}$ atoms/cm$^3$.

19 Claims, 3 Drawing Sheets

(51) Int. Cl.
  *H01L 29/66* (2006.01)
  *H01L 29/778* (2006.01)
  *H01L 29/20* (2006.01)
  *H01L 29/40* (2006.01)
  *H01L 29/423* (2006.01)
  *H01L 29/207* (2006.01)

(52) U.S. Cl.
  CPC ...... *H01L 29/1066* (2013.01); *H01L 29/2003* (2013.01); *H01L 29/207* (2013.01); *H01L 29/404* (2013.01); *H01L 29/42376* (2013.01)

(58) Field of Classification Search
  USPC ......................................................... 257/76
  See application file for complete search history.

(56) References Cited

U.S. PATENT DOCUMENTS

| | | | |
|---|---|---|---|
| 7,859,057 B2 | 12/2010 | Yedinak et al. | |
| 8,017,978 B2 | 9/2011 | Lidow et al. | |
| 8,357,976 B2 | 1/2013 | Yedinak et al. | |
| 8,368,120 B2 | 2/2013 | Lidow et al. | |
| 8,575,660 B2 | 11/2013 | Nelson et al. | |
| 2005/0110042 A1* | 5/2005 | Saito | H01L 29/402 257/192 |
| 2010/0289067 A1 | 11/2010 | Mishra et al. | |
| 2013/0069208 A1* | 3/2013 | Briere | H01L 21/0237 257/655 |
| 2014/0015608 A1* | 1/2014 | Kotani | H01L 29/2003 330/277 |
| 2014/0197418 A1* | 7/2014 | Chen | H01L 21/0254 257/76 |
| 2014/0239308 A1 | 8/2014 | Hallin et al. | |
| 2014/0264367 A1 | 9/2014 | Banerjee et al. | |
| 2015/0041825 A1* | 2/2015 | Liu | H01L 29/66462 257/77 |
| 2015/0076509 A1* | 3/2015 | Ishiguro | H01L 29/7787 257/76 |
| 2016/0043181 A1 | 2/2016 | Liu et al. | |
| 2016/0079066 A1* | 3/2016 | Takada | H01L 21/283 257/409 |

OTHER PUBLICATIONS

Tanaka, Kenichiro et al., "Effects of Deep Trapping States at High Temperatures on Transient Performance of AlGaN/GaN Heterostructure Field-Effect Transistors," Japanese Journal of Applied Physics, vol. 52, dated Mar. 21, 2013, pp. 04CF07-1-04CF07-5.

* cited by examiner

US 10,062,756 B2

SEMICONDUCTOR STRUCTURE INCLUDING A DOPED BUFFER LAYER AND A CHANNEL LAYER AND A PROCESS OF FORMING THE SAME

CROSS-REFERENCE TO RELATED APPLICATION

This application claims priority under 35 U.S.C. § 119(e) to U.S. Provisional Patent Application No. 62/072,607 entitled "Semiconductor Structures and Methods," by Peter Moens, filed Oct. 30, 2014, which is assigned to the current assignee hereof and incorporated herein by reference in its entirety.

FIELD OF THE DISCLOSURE

The present disclosure relates to electronic devices, and more particularly to, electronic devices including channel layers having compound semiconductor materials.

RELATED ART

Current collapse is a problem with high electron mobility transistors (HEMTs), and GaN transistors in particular. Attempts to address current collapse can cause other problems, such as increased surface roughness with the channel layer or relatively high on-state resistance. Increased surface roughness and high sheet resistance are undesired.

BRIEF DESCRIPTION OF THE DRAWINGS

Embodiments are illustrated by way of example and are not limited in the accompanying figures.

Figure 1:
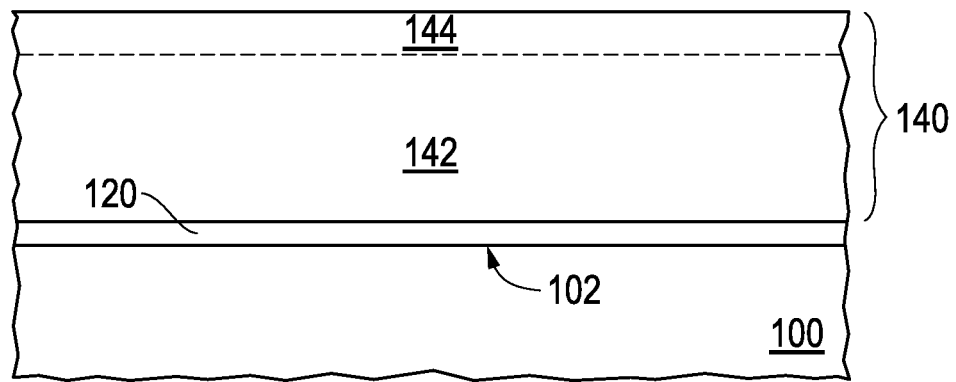
FIG. 1 includes an illustration of a cross-sectional view of a portion of a workpiece including a substrate, a nucleation layer, and a high-voltage blocking layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "compound semiconductor" is intended to mean a semiconductor material that includes at least two different elements. Examples include SiC, SiGe, GaN, InP, $Al_xGa_{(1-x)}N$, CdTe, and the like. A III-V semiconductor material is intended to mean a semiconductor material that includes at least one trivalent metal element and at least one Group 15 element. A III-N semiconductor material is intended to mean a semiconductor material that includes at least one trivalent metal element and nitrogen. A Group 13-Group 15 semiconductor material is intended to mean a semiconductor material that includes at least one Group 13 element and at least one Group 15 element.

The term "carrier impurity" is intended to mean (1) when an acceptor, an impurity within a compound having a different valence state as compared to at least 90% of all cations within the compound, or (2) when a donor, an impurity within a compound having a different valence as compared to at least 90% of all anions within the compound. For example, C, Mg, and Si are acceptors with respect to GaN because they can trap electrons. As used herein, Al is not a carrier impurity with respect to GaN because Al and Ga have a 3+ valence. A carrier impurity may be intentionally added or may be present as a naturally occurring impurity or as a consequence of forming a layer that includes the impurity. Acceptors and donors are carrier impurities of opposite carrier types.

Although a layer or a region may be described herein as a donor impurity type or an acceptor impurity type, skilled artisans understand that the impurity types can be reversed and are also possible in accordance with the present description.

Unless stated explicitly to the contrary, the terms "carrier impurity concentration" or "concentration of a carrier impurity ", when referring to a layer or a region, is intended to mean an average concentration for such layer or region.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

Furthermore, MOCVD can mean metalorganic chemical vapor deposition or metalorganic vapor phase epitaxy or organometallic vapor phase epitaxy, or any other methods of growth or deposition which are known in the art. As used herein, MOCVD can also mean any other methods of forming a layer from a metalorganic precursor or a combination of metal and organic precursors.

Group numbers corresponding to columns within the Periodic Table of Elements based on the IUPAC Periodic Table of Elements, version dated Jan. 21, 2011.

The term "normal operation" and "normal operating state" refer to conditions under which an electronic component or device is designed to operate. The conditions may be obtained from a data sheet or other information regarding voltages, currents, capacitances, resistances, or other electrical parameters. Thus, normal operation does not include operating an electrical component or device well beyond its design limits.

The term "high voltage," with reference to a layer, a structure, or a device, means that such layer, structure, or device can withstand at least 150 V difference across such layer, structure, or device (e.g., between a source and a drain of a transistor when in an off-state) without exhibiting dielectric breakdown, avalanche breakdown, or the like.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A semiconductor structure can include a substrate, a high-voltage blocking layer overlying the substrate, a doped buffer layer overlying the high-voltage layer, and a channel layer overlying the doped buffer layer, wherein the doped buffer layer and the channel layer include a same compound semiconductor material, and the doped buffer layer has a carrier impurity type at a first carrier impurity concentration, the channel buffer layer has the carrier impurity type at a second carrier impurity concentration that is less than the first carrier impurity concentration. In an embodiment, the channel layer has a thickness of at least 650 nm. The relatively thicker channel layer can help to reduce the vertical leakage current when the semiconductor structure includes a high electron mobility transistor. In another embodiment, the high-voltage blocking includes a proximal region that is 1000 nm thick and adjacent to the doped buffer layer, and each of the proximal region, the doped buffer layer, and the channel layer has an Fe impurity concentration less than $5 \times 10^{15}$ atoms/cm$^3$. A low Fe impurity concentration allows the semiconductor structure to be used with electronic components that operate at high voltages, such as 150 V and higher. In another embodiment, the doped buffer and channel layer can be GaN layers, and thus, a smoother interface between the doped buffer and channel layer can be formed, as opposed to a semiconductor structure in which an AlGaN layer replaces the doped GaN buffer layer. A high electron mobility transistor can be formed that is less likely to experience current collapse and has a lower on-state resistance at room temperature.

The concepts and design considerations are better understood after reading the embodiments that follow. Much of the description below will address GaN as the material of the channel layer as a specific example in order to simplify understanding of the concepts and design considerations. Clearly, embodiments of the present invention are not limited to a GaN channel layer. After reading the specification in its entirety, skilled artisans will appreciate that the embodiments are merely for illustrative purposes and do not limit scope of the appended claims.

FIG. 1 includes an illustration of a cross-sectional view of a portion of a workpiece that includes a substrate 100, a nucleation layer 120, and a high-voltage blocking layer 140. The substrate 100 has a primary surface 102 and can include silicon, GaN, diamond, sapphire (monocrystalline Al$_2$O$_3$), silicon carbide (SiC), aluminum nitride (AlN), gallium oxide (Ga$_2$O$_3$), spinel (MgAl$_2$O$_4$), another suitable substantially monocrystalline material, or the like. The selection of the particular material and crystal orientation along the primary surface 102 may depend on the composition of the high-voltage blocking layer 140 that will be subsequently formed over the substrate 100.

The nucleation layer 120 can help to epitaxially grow the high-voltage blocking layer 140. In an embodiment, the nucleation layer 120 may include one or more elements that are common to the subsequently formed high-voltage blocking layer 140. In an embodiment, the nucleation layer 120 can include a III-V material, and in a particular embodiment, the nucleation layer 120 can be an Al$_x$Ga$_{(1-x)}$N, where $0.8 \leq x \leq 1$. In a more particular embodiment, the nucleation layer 120 is a AlN layer. The thickness of the nucleation layer can be in a range of 10 nm to 400 nm.

The high-voltage blocking layer 140 can include a plurality of films. The composition of the films may depend on the voltage at which the electronic device normally operates, the composition of the subsequently-formed channel layer, or both. For a relatively high voltage device, the high-voltage blocking layer may need to support 300 V, 600 V, 1100 V, or even higher. The overall thickness of the high-voltage blocking layer 140 can be in a range of 0.5 micron to 10 microns. In a particular embodiment, the overall thickness is in a range of 1 micron to 6 microns. As the operating voltage increases, the complexity and overall thickness of the high-voltage blocking layer 140 may increase. The high-voltage blocking layer 140 can include III-V material. In an embodiment, the high-voltage blocking layer 140 can have a step-graded AlGaN layer. More particularly, the high-voltage blocking layer 140 can include Al$_y$Ga$_{(1-y)}$N, where $0 \leq y \leq 1$, where the content of Al decreases and the content of Ga content increases as the distance from the nucleation layer 120 increases. For example, different films with a step-wise decrease in Al %, for example, a film closest to the nucleation layer 120 can have, for example, approximately 60% Al, an overlying film can have, for example, approximately 40% Al, etc.). In another embodiment, the high-voltage blocking layer 140 can include a super lattice structure, for example, with alternating thin AlN and GaN films, or alternating thin AlN and AlGaN films, or a GaN film or any other film or combination of films useful for supporting a high voltage across the high-voltage blocking layer 140.

The high-voltage blocking layer 140 can be undoped, or doped with C, Fe, or any other carrier impurity or combination of carrier impurity used with a high-voltage blocking layer. In the embodiment as illustrated, the high-voltage blocking layer 140 includes a lower region 142 and an upper region 144. Each of the lower and upper regions 142 and 144 can include a single film, a plurality of films, or be part of a larger film, and in another embodiment, the lower and upper regions 142 and 144 can be part of the same film. The selection of carrier impurities can affect the ability to support a voltage, and carrier impurities within the upper region 144, such as the uppermost 1000 nm of the high-voltage blocking layer 140, may be more significant than the lower region 142.

In an embodiment, the upper region 144, and potentially all or most of the lower region 142, may be substantially free of donors, such as Fe, Si, Ge, or any combination thereof, or not have a donor impurity type. The donors may not be able to support a sufficiently high voltage, such as at least 500 V, 1100 V, or even higher when the charge carriers for a transistor or other component are electrons. Another particular problem caused by Fe is that it can cause a memory effect, in which Fe remains present in the reactor even after the supply is shut off. As such, Fe will exhibit a tail in the doping profile, which is uncontrolled and hence not desirable. In a particular embodiment, the high-voltage blocking layer 140 is substantially free of Fe. The upper region 144 may include an acceptor, such as Be, C, Mg, Zn, Cd, or any combination thereof. In a particular embodiment, the upper region 144 can include C at a concentration of at least $1 \times 10^{19}/cm^{-3}$ In another particular embodiment, a different acceptor or combination of acceptors can be used.

Figure 2:
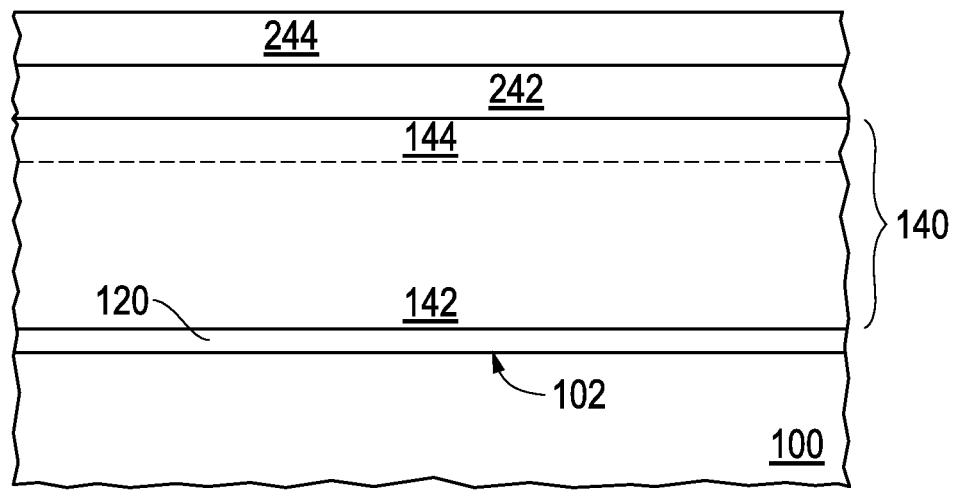
FIG. 2 includes an illustration of a cross-sectional view of the workpiece of FIG. 1 after forming a doped buffer layer and a channel layer.

In FIG. 2, a doped buffer layer 242 and a channel layer 244 are formed over the high-voltage blocking layer 140. The doped buffer layer 242 is closer to the high-voltage blocking layer 140 as compared to the channel layer 244, and in a particular embodiment, the doped buffer layer 242 is in contact with the upper region 144 of the high-voltage blocking layer 140. The composition and thickness of the doped buffer layer 242 may depend on the composition of the channel layer 244. The channel layer 244 will be first described followed by the doped buffer layer 242. While some details are specific for a GaN channel layer, after reading the specification, skilled artisans will be able to make embodiments that meet their needs or desires, even if the composition of the channel layer 244 is not GaN.

The channel layer 244 includes a semiconductor material, such as a III-V semiconductor material. In another embodiment, the semiconductor material includes a single Group 13 element, or in another embodiment, includes at least two different Group 13 elements. In a particular embodiment, the semiconductor material is GaN.

The carrier impurity can provide carrier traps within the channel layer 244 and may have an acceptor or donor impurity type. In a particular embodiment, the carrier impurity is an acceptor impurity type, and in a more particular embodiment, the carrier impurity is C. A high density two dimensional electron gas (2DEG) can be formed near the interface of the channel layer 244 and a subsequently-formed barrier layer, and is responsible for high mobility and lower resistivity of a transistor that can be formed using the channel layer 244. Any reduction of the 2DEG electrons will increase the on-state resistance ($R_{ON}$) of the transistor. In an embodiment, the acceptors can trap the electrons in the channel layer 244 due to high electron density at the beginning. Once the device is in an off state, high electrical fields from the gate edge, field plate edges, and drain edge can de-trap the electrons from the electron traps, and these de-trapped electrons can be driven toward the underlying layers. Thus, the concentration of acceptors (when the carriers are electrons) or donors (when the carriers are holes) may be kept as low as reasonably possible. In a particular embodiment, acceptors can include carbon from a source gas when metalorganic chemical vapor deposition (MOCVD) is used to form the channel layer 244. Some carbon can become incorporated as the channel layer 244 is grown. The carbon content may be controlled by controlling the deposition conditions, such as the deposition temperature and flow rates.

In an embodiment, the channel layer 244 has a carrier impurity concentration that is at least $1 \times 10^{13}$ atoms/cm$^3$ and at most $1 \times 10^{14}$ atoms/cm$^3$, at most $1 \times 10^{15}$ atoms/cm$^3$, at most $5 \times 10^{15}$ atoms/cm$^3$, or at most $3 \times 10^{16}$ atoms/cm$^3$. In a further embodiment, the carrier impurity concentration is in a range of $1 \times 10^{14}$ atoms/cm$^3$ to $3 \times 10^{16}$ In a particular embodiment, the lowest trap concentration is desired but may be limited by growth or deposition conditions and purity of the precursors. In an embodiment, the carrier impurity concentration can be uniform throughout the thickness of the channel layer 244.

In an embodiment, the channel layer 244 has a thickness that is at least 650 nm or at least 700 nm. When the thickness is less than 650 nm, such as 600 nm and lower, vertical leakage current may be too high and lead to current collapse. In another embodiment, the channel layer 244 has a thickness that is at most 2000 nm, or at most 1000 nm. In a further embodiment, the channel layer 244 has a thickness is in a range of 650 nm to 2000 nm or 700 nm to 1000 nm.

The doped buffer layer 242 can help to collect de-trapped carriers from the channel layer 244. In an embodiment, the doped buffer layer 242 can include a III-V semiconductor material. In a particular embodiment, the doped buffer layer 242 includes GaN. In a particular embodiment, the doped buffer layer and the channel layer 244 include the same compound semiconductor material, GaN.

The carrier impurity can provide carrier traps within the doped buffer layer 242 and may have an acceptor or donor impurity type. In a particular embodiment, the carrier impurity is an acceptor, and in a more particular embodiment, the carrier impurity is C. The doped buffer layer 242 can have a higher carrier impurity concentration as compared to the channel layer 244. In an embodiment, the doped buffer layer 242 has a carrier impurity at a concentration of at least $1 \times 10^{19}$ atoms/cm$^3$, at least $2 \times 10^{19}$ atoms/cm$^3$, or at least $5 \times 10^{19}$ atoms/cm$^3$, and in another embodiment, the doped buffer layer 242 has a carrier impurity at a concentration of at most $1 \times 10^{21}$ atoms/cm$^3$. In an embodiment, the carrier impurity concentration can be uniform throughout the thickness of the doped buffer layer 242.

In an embodiment, the doped buffer layer 242 has a thickness that is at least 300 nm, at least 400 nm, or at least 450 nm, and in another embodiment, the doped buffer layer 242 has a thickness that is at most 1500 nm, at most 1100 nm, or at most 900 nm. In a further embodiment, the region has a thickness in a range of 300 nm to 1500 nm, 400 nm to 1100 nm, or 450 nm to 900 nm. The doped buffer layer 242 can have a thickness that is the same, greater than or less than the thickness of the channel layer 244.

Figure 3:
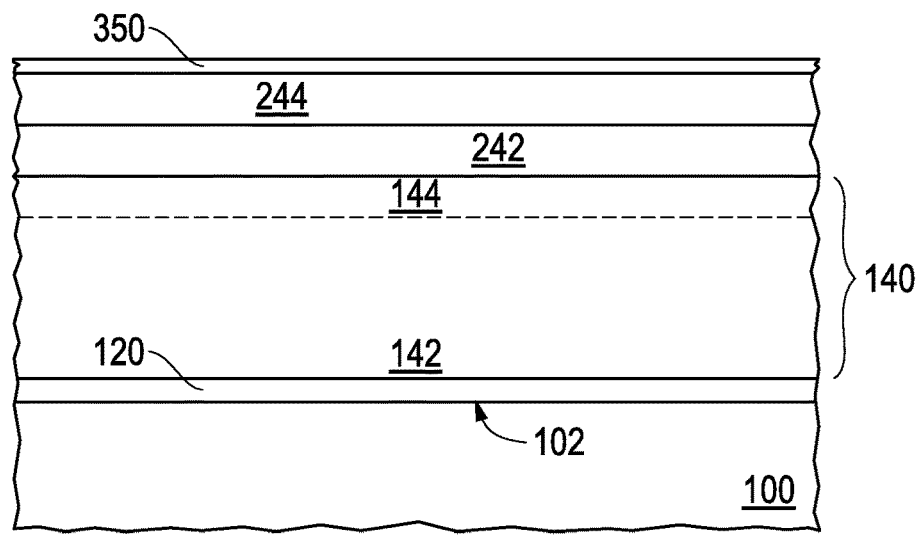
FIG. 3 includes an illustration of a cross-sectional view of the workpiece of FIG. 2 after forming a barrier layer.

A barrier layer 350 is formed over the channel layer 244, as illustrated in FIG. 3. The barrier layer 350 can include a III-V semiconductor material. In an embodiment, the barrier layer 350 includes at least two different Group 13 elements. In another embodiment, the barrier layer 350 includes $Al_zGa_{(1-z)}N$, wherein $0<z<1$. In a particular embodiment, z is at least 0.18, at least 0.20, or at least 0.22, and in another particular embodiment, z is at most 0.30, at most 0.28, or at most 0.26. In a particular embodiment, z is in a range of 0.18 to 0.30 or 0.20 to 0.28.

In an embodiment, the barrier layer 350 has a carrier impurity concentration that is at least $1\times10^{14}$ atoms/cm$^3$, at least $1\times10^{15}$ atoms/cm$^3$, or at least $5\times10^{15}$ atoms/cm$^3$, and in another embodiment, the carrier impurity concentration is at most $5\times10^{18}$ atoms/cm$^3$, at most $1\times10^{18}$ atoms/cm$^3$, or at most $1\times10^{17}$ atoms/cm$^3$. In a further embodiment, the carrier impurity concentration is in a range of $1\times10^{14}$ atoms/cm$^3$ to $5\times10^{18}$ atoms/cm$^3$, $1\times10^{15}$ atoms/cm$^3$ to $1\times10^{18}$ atoms/cm$^3$, or $5\times10^{15}$ atoms/cm$^3$ to $1\times10^{17}$ atoms/cm$^3$. In an embodiment, the carrier impurity concentration in the barrier layer 350 can be selected to maintain the strain of the barrier layer 350 by acceptors, such as carbon, due to the higher cohesive energy of such an acceptor. In another embodiment, similar effects may be seen with other carrier impurities.

In an embodiment, the barrier layer 350 has a thickness that is at least 5 nm, at least 11 nm, or at least 20 nm, and in another embodiment, the barrier layer 350 has a thickness that is at most 200 nm, at most 150 nm, or at most 90 nm. In a further embodiment, the barrier layer 350 has a thickness is in a range of 5 nm to 200 nm, 11 nm to 150 nm, or 20 nm to 90 nm.

The nucleation layer 120, the high-voltage blocking layer 140, the doped buffer layer 242, and channel layer 244, the barrier layer 350, or any combination thereof can be formed using Molecular Beam Epitaxy (MBE), Physical Vapor Deposition (PVD), or using chemical vapor deposition techniques such as, for example, a Metalorganic Chemical Vapor Deposition (MOCVD) technique, a Plasma-enhanced Chemical Vapor Deposition (PECVD) technique, a Low Pressure Chemical Vapor Deposition (LPCVD) technique, or the like. In a particular embodiment, the high-voltage blocking layer 140 is epitaxially grown from the nucleation layer 120, the doped buffer layer 242 is epitaxially grown from the high-voltage blocking layer 140, the channel layer 244 is epitaxially grown from the doped buffer layer 242, and the barrier layer 350 is epitaxially grown from the channel layer 244. The epitaxial growth can be performed as a chemical vapor deposition using an organometallic compound, a hydride, or a halide. In a particular embodiment, an alkyl compound may be used. For example, a gallium source may include $Ga(C_xH_{2x+2})_3$, where x is 1 to 3. A nitrogen source can include $NH_3$ or $N_2H_4$. Carrier impurities, such as acceptors or donors, may be incorporated from one or more of the sources (for example, C from the Ga source gas) or may be separately added if needed or desired.

Figure 4:
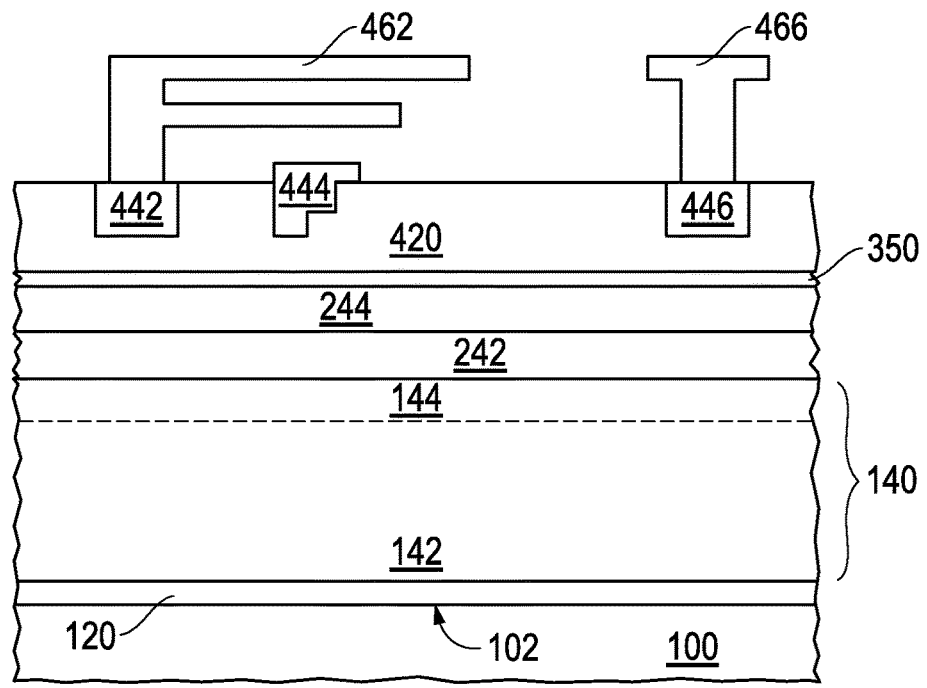
FIG. 4 includes an illustration of a cross-sectional view of the workpiece of FIG. 3 after forming a substantially completed transistor.

Processing can be continued to form a substantially completed transistor as illustrated in FIG. 4. In a particular embodiment, the transistor is a high electron mobility transistor (HEMT). An insulating layer 420 can be formed over the barrier layer 350 and include one or more insulating films. In an embodiment, the insulating layer 420 can include a nitride compound, such as silicon nitride, aluminum nitride, or the like. In a particular embodiment, the insulating layer can be grown in-situ, that is, in the same deposition chamber as forming the barrier layer 350, without breaking vacuum. When the insulating layer 420 is a silicon nitride layer, the insulating layer can help to reduce surface traps. In another embodiment, the insulating layer 420 may include an oxide film. If oxide is incompatible or causes a processing or other issue with the channel layer 244 or an underlying layer, a film of a different composition may be formed before the oxide. In a particular embodiment, a film within the gate dielectric layer may include a nitride and can be partly oxidized to form the oxide layer.

Portions of the insulating layer 420 can be removed at locations to form a gate well and openings for source and drain electrodes. The openings for the source and drain electrodes may terminate within the insulating layer 420 (illustrated), within the barrier layer 350 or extend through both the insulating layer 420 and the barrier layer 350. The gate well may terminate within the insulating layer 420 (illustrated) or extend into the barrier layer 350. The gate well does not extend into the channel layer 244. The source electrode 442, the gate electrode 444, and the drain electrode 446 are then formed. In the embodiment as illustrated, the barrier layer 350 is disposed between the channel layer 244 and the gate electrode 444. The portions of the gate electrode 444 that are further from the channel layer 244 and closer to the drain electrode 446 act as a shield plate to reduce the gate-to-drain electric field and capacitance. Interconnects 462 and 466 are formed that are electrically connected to the source electrode 442 and the drain electrode 446, respectively. The portions of the interconnect 462 that extend over the gate electrode and toward to the drain electrode 446 act as a shield plate to reduce the gate-to-drain electric field and capacitance. Although not illustrated, an interconnect to the gate electrode 444 is also formed. One or more additional insulating layers, conductive plugs, and interconnect levels can be formed if needed or desired. Further, additional transistors may be formed. In a particular embodiment, a plurality of the transistors can be connected in parallel to provide an equivalent transistor having a sufficiently large channel width to support high current flow when the transistor is on.

Figure 5:
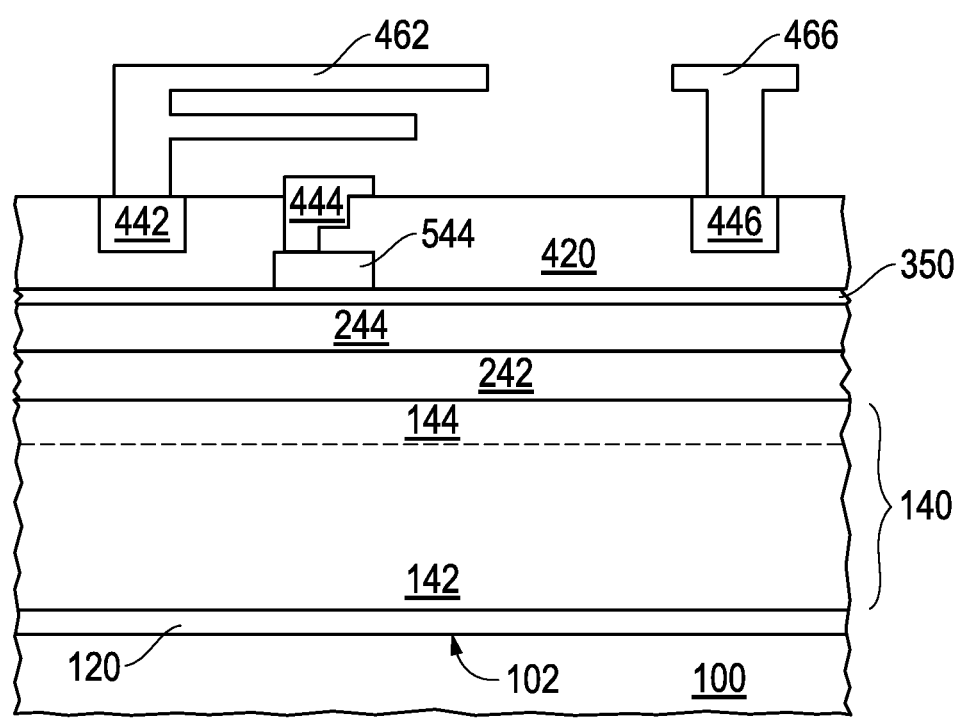
FIG. 5 includes an illustration of a cross-sectional view of a portion of a workpiece similar to one the illustrated in FIG. 4 except that the transistor structure is an enhancement-mode transistor.

FIG. 4 includes an illustration of a depletion-mode transistor. In another embodiment, an enhancement-mode transistor can be formed, as illustrated in FIG. 5. In FIG. 5, a layer 544 having a p-type impurity type, such as e.g., Mg can be formed. In a particular embodiment, the layer 544 includes $Al_aGa_{(1-a)}N$, wherein $0<a<1$.

In another embodiment (not illustrated), a spacer layer is can be formed after the channel layer 244 and before the barrier layer 350. The spacer layer can include a III-V semiconductor material. In an embodiment, the spacer layer includes at least two different Group 13 elements. In another embodiment, the spacer layer can includes $Al_bGa_{(1-b)}N$, wherein $0<b<1$. In a particular embodiment, b is at least 0.40, at least 0.50, or at least 0.60, and in another particular embodiment, b is at most 1.00, at most 0.90, or at most 0.80. In a particular embodiment, b is in a range of 0.04 to 1.00, 0.50 to 0.90, or 0.60 to 0.80. In a further embodiment, the spacer layer has a higher Al content as compared to the barrier layer 350.

In an embodiment, the spacer layer has a carrier impurity concentration that is at least $1\times10^{14}$ atoms/cm$^3$, at least $1\times10^{15}$ atoms/cm$^3$, or at least $5\times10^{15}$ atoms/cm$^3$, and in another embodiment, the carrier impurity concentration is at most $5\times10^{18}$ atoms/cm$^3$, at most $1\times10^{18}$ atoms/cm$^3$, or at most $1\times10^{17}$ atoms/cm$^3$. In a further embodiment, the carrier impurity concentration is in a range of $1\times10^{14}$ atoms/cm$^3$ to $5\times10^{18}$ atoms/cm$^3$, $1\times10^{54}$ atoms/cm$^3$ to $1\times10^{18}$ atoms/cm$^3$, or $5\times10^{15}$ atoms/cm$^3$ to $1\times10^{17}$ atoms/cm$^3$. In an embodiment, the carrier impurity concentration in the spacer layer can be selected to maintain the strain of the spacer layer by acceptors, such as carbon, due to the higher cohesive energy of such an acceptor. In another embodiment, similar effects may be seen with other carrier impurities.

In an embodiment, the spacer layer is thinner than the barrier layer 350 has a thickness that is at least 0.5 nm, at least 1 nm, or at least 5 nm, and in another embodiment, the spacer layer has a thickness that is at most 10 nm. In a further embodiment, the spacer layer has a thickness is in a range of 0.5 nm to 5 nm.

The embodiments described herein can be used to form a high voltage device that is relatively more resistant to current collapse. Design considerations may be more as stringent for a relatively high voltage device, such as one that normally operates at a voltage of at 150 V, 500 V, or higher, as compared to a relatively low voltage device, such as one operating at approximately 50 V or lower, for example, a radio-frequency device. Each of the doped and channel layers 242 and 244 have sufficient thicknesses to reduce or block vertical leakage current (that is, leakage current that would otherwise flow into the high-voltage blocking layer 140) in relatively high voltage devices. Furthermore, the thickness of the channel layer 244 helps to keep electron traps away from the region where the 2DEG is formed. Additionally, when the doped buffer layer 242 is a GaN layer, it has a relatively smoother surface, as compared to an AlGaN layer. Accordingly, a HEMT formed using a semiconductor structure as described has a lower likelihood of current collapse during normal operation.

In an embodiment, a HEMT can be formed with doped and channel layers 242 and 244 that include C as an acceptor dopant. $R_{ON}$ at room temperature for such a HEMT is significantly lower than a comparable HEMT that has an AlGaN layer instead of the C-doped GaN layer for the doped buffer layer 242. A high-voltage HEMT with the C-doped GaN layer has an $R_{ON}$ at room temperature that is in a range of 20% to 50% lower, as compared to a HEMT that has an AlGaN layer between the high-voltage blocking layer 140 and the channel layer 244.

The carrier impurity concentration within each of the doped buffer layer 242 and the channel layer 244 is substantially uniform throughout the layer. Thus, the change in carrier impurity concentration, if any, between either layer and its immediately adjacent layers are step changes. The upper region 144, and potentially the lower region 142, of the high-voltage blocking layer 140 is not a donor impurity type. Accordingly, grading a concentration across the thickness of the doped buffer layer 242 is not needed. A similar relationship holds in an embodiment in which the doped buffer and channel layers have a donor impurity type and the high-voltage blocking layer 140 is not an acceptor impurity type.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1. A semiconductor structure comprising:
a substrate;
a high-voltage blocking layer overlying the substrate;
a doped buffer layer overlying the high-voltage layer; and
a channel layer overlying the doped buffer layer and having a thickness of at least 650 nm,
wherein:
the doped buffer layer and the channel layer include a same compound semiconductor material, and
the doped buffer layer has a carrier impurity type at a first carrier impurity concentration, the channel buffer layer has the carrier impurity type at a second carrier impurity concentration that is less than the first carrier impurity concentration.

Embodiment 2. The semiconductor structure of Embodiment 1, wherein:
the high-voltage blocking layer includes a proximal region that is 1000 nm thick;
the doped buffer layer is closer to the proximal region than to any other region of the high voltage blocking layer; and
the proximal region has an Fe impurity concentration less than $5 \times 10^{15}$ atoms/cm$^3$.

Embodiment 3. The semiconductor structure of Embodiment 1, further comprising a source electrode, a drain electrode, and a gate electrode, wherein a transistor includes the channel layer, the source electrode, the drain electrode, and the gate electrode.

Embodiment 4. The semiconductor structure of Embodiment 3, wherein the transistor is a high-voltage, high electron mobility transistor.

Embodiment 5. The semiconductor structure of Embodiment 1, wherein the same compound semiconductor material is a III-V semiconductor material.

Embodiment 6. The semiconductor structure of Embodiment 1, wherein the same compound semiconductor material is GaN.

Embodiment 7. The semiconductor structure of Embodiment 1, wherein the carrier impurity is C, and the first carrier impurity concentration is at least $1 \times 10^{19}$ atoms/cm$^3$.

Embodiment 8. The semiconductor structure of Embodiment 7, wherein the second carrier impurity concentration is at most $5 \times 10^{16}$ atoms/cm$^3$.

Embodiment 9. The semiconductor structure of Embodiment 1, wherein the semiconductor structure has a lower vertical leakage current as compared to have another semiconductor structure that is identical except that the thickness of the channel layer is at most 600 nm.

Embodiment 10. The semiconductor structure of Embodiment 1, further comprising a barrier layer overlying the channel layer.

Embodiment 11. The semiconductor structure of Embodiment 10, further comprising a silicon nitride layer overlying the barrier layer.

Embodiment 12. A semiconductor structure comprising:
a substrate;
a high-voltage blocking layer overlying the substrate;
a doped buffer layer overlying the high-voltage layer; and
a channel layer overlying the doped buffer layer,
wherein:
the doped buffer layer and the channel layer include a same compound semiconductor material;
the doped buffer layer has a carrier impurity type at a first carrier impurity concentration, the channel buffer layer has the carrier impurity type at a second carrier impurity concentration that is less than the first carrier impurity concentration; and
each of the high-voltage blocking layer, the doped buffer layer, and the channel layer has an Fe impurity concentration less than $5 \times 10^{15}$ atoms/cm$^3$.

Embodiment 13. A process of forming a semiconductor structure comprising:
forming a doped buffer layer over a high-voltage blocking layer that overlies a substrate;
forming a channel layer over the doped buffer layer, wherein:

the doped buffer layer and the channel layer include a same compound semiconductor material;

the doped buffer layer has a carrier impurity type at a first carrier impurity concentration, the channel buffer layer has the carrier impurity type at a second carrier impurity concentration that is less than the first carrier impurity concentration; and the channel layer is formed to a thickness of at least 650 nm.

Embodiment 14. The process of Embodiment 13, wherein the carrier impurity is C.

Embodiment 15. The process of Embodiment 14, wherein the doped buffer layer and the channel layer are formed using a same metal-containing precursor, and the doped buffer layer and channel layer are formed at different temperatures.

Embodiment 16. The process of Embodiment 14, wherein the metal-containing precursor is $Ga(C_xH_{2x+2})_3$, where x is 1 to 3, and the carrier impurity is generated from the metal-containing precursor.

Embodiment 17. The process of Embodiment 13, further comprising forming the high-voltage blocking layer over the substrate, wherein the high-voltage blocking layer includes a region that is 1000 nm thick is along a surface opposite the substrate, and has a Fe impurity concentration less that $5 \times 10^{15}$ atoms/cm$^3$.

Embodiment 18. The process of Embodiment 17, wherein the high-voltage blocking layer can support a voltage difference of at least 500 V across a thickness of the high-voltage blocking layer.

Embodiment 19. The process of Embodiment 18, further comprising forming a barrier layer over the channel layer, wherein the barrier layer includes $Al_{(1-x)}Ga_xN$, wherein $0<x<1$.

Embodiment 20. The process of Embodiment 19, further comprising forming a silicon nitride layer over the barrier layer.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A semiconductor structure comprising:
    a substrate;
    a high-voltage blocking layer overlying the substrate;
    a doped buffer layer overlying the high-voltage blocking layer and having a thickness of at least 300 nm;
    a channel layer overlying and directly contacting the doped buffer layer and having a thickness of at least 650 nm; and
    a gate electrode comprising a shielding portion,
    wherein:
        the doped buffer layer and the channel layer include a same compound semiconductor material, and
        the doped buffer layer has a carrier impurity type at a first carrier impurity concentration of at least $1 \times 10^{19}$ atoms/cm$^3$, wherein the first carrier impurity concentration is uniform throughout the thickness of the doped buffer layer, and the channel layer has the carrier impurity type at a second carrier impurity concentration that is less than the first carrier impurity concentration.

2. The semiconductor structure of claim 1, wherein:
    the high-voltage blocking layer includes a proximal region that is 1000 nm thick;
    the doped buffer layer is closer to the proximal region than to any other region of the high voltage blocking layer; and
    the proximal region has an Fe impurity concentration less than $5 \times 10^{15}$ atoms/cm$^3$.

3. The semiconductor structure of claim 1, further comprising a source electrode and a drain electrode, wherein a transistor includes the channel layer, the source electrode, the drain electrode, and the gate electrode.

4. The semiconductor structure of claim 3, wherein the transistor is a high-voltage, high electron mobility transistor.

5. The semiconductor structure of claim 1, wherein the same compound semiconductor material is a III-V semiconductor material.

6. The semiconductor structure of claim 1, wherein the same compound semiconductor material is GaN.

7. The semiconductor structure of claim 1, wherein the carrier impurity is C, and the second carrier impurity concentration is at most $5 \times 10^{16}$ atoms/cm$^3$.

8. The semiconductor structure of claim 1, wherein the semiconductor structure has a lower vertical leakage current as compared to have another semiconductor structure that is identical except that the thickness of the channel layer is at most 600 nm.

9. The semiconductor structure of claim 1, further comprising a barrier layer overlying the channel layer.

10. The semiconductor structure of claim 1, further comprising an interconnect comprising a plurality of shielding portions extending over the gate electrode.

11. The semiconductor structure of claim 1, wherein the doped buffer layer has a thickness of at least 450 nm.

12. A process of forming a semiconductor structure comprising:
    forming a doped buffer layer over a high-voltage blocking layer that overlies a substrate, wherein the doped buffer layer has a thickness of at least 300 nm;
    forming a channel layer over and directly contacting the doped buffer layer, wherein the channel layer has a thickness of at least 650 nm; and forming a gate electrode comprising a shielding portion, wherein:

the doped buffer layer and the channel layer include a same compound semiconductor material; and the doped buffer layer has a carrier impurity type at a first carrier impurity concentration of at least $1\times10^{19}$ atoms/cm$^3$, wherein the first carrier impurity concentration is uniform throughout the thickness of the doped buffer layer, and the channel layer has the carrier impurity type at a second carrier impurity concentration that is less than the first carrier impurity concentration.

13. The process of claim 12, wherein the carrier impurity is C.

14. The process of claim 13, wherein the doped buffer layer and the channel layer are formed using a same metal-containing precursor, and the doped buffer layer and channel layer are formed at different temperatures.

15. The process of claim 13, wherein the metal-containing precursor is Ga(C$_x$H$_{2x+2}$)$_3$, where x is 1 to 3, and the carrier impurity is generated from the metal-containing precursor.

16. The process of claim 12, further comprising forming the high-voltage blocking layer over the substrate, wherein the high-voltage blocking layer includes a region that is 1000 nm thick along a surface opposite the substrate, and has an Fe impurity concentration less than $5\times10^{15}$ atoms/cm$^3$.

17. The process of claim 16, wherein the high-voltage blocking layer can support a voltage difference of at least 500 V across a thickness of the high-voltage blocking layer.

18. The process of claim 12, wherein the doped buffer layer has a thickness of at least 450 nm further comprising forming a barrier layer over the channel layer, wherein the barrier layer includes Al$_{(1-x)}$Ga$_x$N, wherein $0<x<1$.

19. The process of claim 12, further comprising forming an interconnect comprising a plurality of shielding portions extending over the gate electrode.

* * * * *